United States Patent
Mengad

(10) Patent No.: US 10,158,288 B2
(45) Date of Patent: Dec. 18, 2018

(54) APPARATUS AND METHOD OF A SLOPE REGULATOR AND REGULATION SLOPE OF SWITCHING POWER FETS

(71) Applicant: Dialog Semiconductor (UK) Limited, London (GB)

(72) Inventor: Zakaria Mengad, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/363,331

(22) Filed: Nov. 29, 2016

(65) Prior Publication Data

US 2018/0152102 A1  May 31, 2018

(51) Int. Cl.
| | |
|---|---|
| *H02J 3/12* | (2006.01) |
| *G05F 1/00* | (2006.01) |
| *H02M 3/156* | (2006.01) |
| *H02M 3/158* | (2006.01) |
| *H03K 17/16* | (2006.01) |
| *H03F 3/217* | (2006.01) |
| *H03K 4/00* | (2006.01) |

(52) U.S. Cl.
CPC ......... *H02M 3/156* (2013.01); *H02M 3/1588* (2013.01); *H03F 3/217* (2013.01); *H03K 4/00* (2013.01); *H03K 17/16* (2013.01); *H03K 17/166* (2013.01)

(58) Field of Classification Search
CPC ........... G05F 1/562; G05F 1/575; G05F 1/595
USPC ................ 323/242, 243, 288, 289
See application file for complete search history.

(56) References Cited

U.S. PATENT DOCUMENTS

| | | | | |
|---|---|---|---|---|
| 6,781,423 | B1 * | 8/2004 | Knoedgen | H03K 17/063 327/110 |
| 7,425,819 | B2 | 9/2008 | Isobe | |
| 7,443,148 | B2 | 10/2008 | Weng | |
| 7,595,624 | B2 | 9/2009 | Tateishi et al. | |
| 2006/0176031 | A1 | 8/2006 | Forman et al. | |
| 2011/0248781 | A1 * | 10/2011 | Gribben | H03F 1/305 330/251 |
| 2015/0234417 | A1 * | 8/2015 | Kawai | G05F 5/00 323/299 |
| 2015/0303806 | A1 * | 10/2015 | Madsen | H02M 7/5383 323/271 |

* cited by examiner

*Primary Examiner* — Gary Nash
(74) *Attorney, Agent, or Firm* — Saile Ackerman LLC; Stephen B. Ackerman

(57) ABSTRACT

In summary, a switching circuit comprising a high side (HS) switch coupled to the output, a low side (LS) switch comprising a MOSFET coupled to the output, and a slope regulator core coupled to the gate of said low side (LS) switch configured to provide control signals to said slope regulator core. In addition, a method of providing a method of a switch circuit comprising the steps the first step, (a) providing a circuit comprising a low side (LS) switch, a high side (HS) switch, and a slope regulator wherein said slope regulator comprises a fast mode, a slope regulator mode, and a hold mode, the second step (b) activating said slope regulator, the third step (c) choosing a fast mode or a slope regulation mode, the fourth step (d) applying either a fast mode or slope regulation mode; the fifth step (e) evaluating the polarity of the signal, the sixth step (f) toggle signal hold_on if the gate is low or toggle signal hold_off if the gate is high.

17 Claims, 18 Drawing Sheets

1800

1801
Providing a circuit comprising a low side (LS) switch, a high side (HS) switch, and a slope regulator wiherein the slope regulator comprises a slope regulator mode

1802
Wherein the slope regulator comprises a first AC loop connected to an output and a gate of the device for which slope regulation is desired

1803
Providing a current to the first AC loop, controlled by a first Idac in the slope regulator mode

FIG. 18

APPARATUS AND METHOD OF A SLOPE REGULATOR AND REGULATION SLOPE OF SWITCHING POWER FETS

BACKGROUND

Field

The disclosure relates generally to an apparatus and, more particularly, to a circuit and method of regulating the output voltage slope of power MOSFETs thereof.

Description of the Related Art

From an application perspective, one of the major differences between DC-DC regulators and Class-D amplifiers is the isolation between the load and the switching outputs. A PMU (Power Management Unit) will be in most cases encapsulated within a shielding case that prevents the output nodes from radiating to the rest of the system, but for a Class-D, the load which can be a speaker or an actuator for haptic feedback is not necessarily placed close to the driver, therefor the Class-D driver must pass an EMI (Electromagnetic Interference) test according to a specific EMC (Electromagnetic Compatibility) standard. One example is the EN55022B—which is a European standard setting limits and methods of measurement of radio disturbance characteristics of information technology equipment FIG. 1 is a plot of electrical field versus frequency. The emitted electrical field 120 in the vicinity of the receiver will be measured accurately up to 1 GHz; a report is generated comparing the measurement to a specified mask, as shown in FIG. 1. The emission spectrum of the amplifier must be below the mask with a well-defined margin. FIG. 1 illustrates the electric field as a function of frequency 100. The signal of EN55011 (Class B) 110 is shown as a function of frequency and compared to the measured signal 120.

One of the common design techniques to reduce this type of emissions is to slow down the output switching of the driver 200, as shown in FIG. 2. FIG. 2 shows a square pulse signal 205 and a trapezoidal pulse signal 210 wherein the trapezoidal pulse signal has defined rising and falling slew rates that are slower than that for square pulse signal 205.

FIG. 3 is a plot of output harmonics versus frequency 300 for a square pulse 310 and trapezoidal pulse 320. FIG. 3 illustrates the spectrum for the pulse waveform is of FIG. 2. If we take a look at the associated spectrum shown in FIG. 3, the trapezoidal output harmonics attenuate vs. frequency much earlier—because inversely proportional to the transition time—and much quicker (second order roll-off instead of first order roll-off in the case of a purely square signal). For example, at a slope of 400 mV/ns, the spurious signals are attenuated by 40 dB when we reach 1 GHz. The corner frequency for the second order roll-off is $$Fc = \frac{Sr}{\pi \cdot PVDD}$$

where Sr is the Slew rate of the output voltage, and PVDD is the Power stage supply voltage. The other major incentive to control the power stage transition rate is the reduction of power supplies ringing which is beneficial for EMI performance and also makes the part more reliable.

FIG. 4 illustrates an economical way to implement a limited output switching rate. FIG. 4 is a circuit schematic of a power FET (Field Effect Transistor) circuit 400 illustrating a prior art embodiment that is known to the inventors. FIG. 4 is supplied by ground PVSS 401, and power supply VDD 402. The circuit contains a high side (HS) switch 440, a low side (LS) switch 430, and an inductor 450. The inductor is connected to output voltage Vo 445. A current source-switch series combination 410 is connected to VDD 402 and supplies current to low side (LS) switch gate 435. A current source-switch series combination 420 is connected to PVSS 401 and supplies current to low side (LS) switch gate 435. The gate switching current is limited either by programmable resistors or current sources, the large Cdg and Cgs capacitances (LS is a power FET driving up to few Amperes) determines the maximum dVo/dt as Idac_on/Cdg for turn-on 410 and Idac_off/Cdg for turn-off 420, where IDAC is a current analog to digital converter.

When implementing the scheme of FIG. 4 on a real power FET 400, the waveforms shown in FIG. 5 are obtained where the 'Vg', 'Vo' and the derivative of the output are reported for turn-on with currents varying from 10 mA up to 2.5 A.

FIG. 5 illustrates output characteristics of a power FET circuit 500 illustrating a prior art circuit known the inventors. FIG. 5 illustrates the signals 'Vg' 510, 'Vo' 520, and gate current 530. FIG. 5 illustrates clearly how non-linear the output is, the slope varies from a maximum of 600 mV/ns down to 87 mV/ns during the same transition. This shows the inherent non-linearity of the device. The Cdg capacitance is strongly non-linear with the voltage and drain current. Also when the device enters the triode region, the gain of the local loop decreases significantly and the capacitance that has to be charged is much larger, which means that maintaining the slope would require the input current to be increased in a controlled way. In other words input current must be adjusted during the whole transition for the slope to stay constant.

FIG. 6 is a circuit schematic of a power FET 600, illustrating a second prior art circuit that is known to the inventor. One way to adjust the input current such that the output slope stays constant is illustrated on FIG. 6. The principle is based on generating an internal reference ramp (Vramp) that has the desired output slope, then a local regulation loop adjusts the input current such that the error between 'Vo' and 'Vramp' is kept very small during the transition. If PVDD 602 is a high voltage (e.g. greater than the process gate breakdown voltage) the error amplifier input stage must tolerate high voltage full scale signal whilst exhibiting a very a high bandwidth. The FIG. 6 circuit is supplied by ground PVSS 601, and power supply PVDD 602. The circuit contains a high side (HS) switch 640, a low side (LS) switch 630, and an inductor 650. The inductor is connected to output voltage Vo 645. A current source-switch series combination 610 is connected to PVDD 602 and supplies current to low side (LS) node through the node Vramp 622 to serve as an input to error amplifier 635. A current source-switch series combination 620 is connected to PVSS 601 and also supplies current through the node Vramp 622 to serve as an input to error amplifier 635. A capacitor Cramp 625 is coupled to Vramp node 622. The comparator 635 has a positive input coupled to output voltage Vo 645, and a negative input connected to Vramp 622. The output of comparator 635 is coupled to the gate of the low side (LS) switch 630.

One of the main challenges of this approach is the very difficult tradeoff between the error amplifier (EA) high bandwidth, loop stability and the idle power specification. Dynamic biasing can be used, meaning that the amplifier consumes current only when a gate transition is produced; however this generates various settling issues that could produce undesirable output artefacts (e.g. as an undesirable step, or undesirable discontinuity) behavior preceding the actual transition. The ramp generation associated HV circuitry tends also to take up area with level shifters and protection circuitry.

FIG. 7 is a circuit schematic 700 of a power FET illustrating a circuit of a variant of the second prior art embodiment that is known to the inventors. To make the error amplifier (EA), from thinner gate devices and under a low voltage supply, one possible approach consists of using a super source follower from the output to command the signal to the second stage B0. The advantage is that only F0/I0 and the ramp generator are HV components, B0 is a ground referred amplifier with smaller devices and potentially lower power consumption. A drawback issue is the additional VNEG supply 703 below PVSS 701 is needed so that F0 can finish the full source excursion down to PVSS 701; also the SSF (super source follower) complicates further the stability of the system since it adds an additional relatively high impedance node to drive B0.

FIG. 8 is a circuit schematic of a power FET illustrating a circuit of a third prior art embodiment that is known to the inventors. An interesting way of controlling more accurately the output slope is shown in FIG. 8. The method is based on applying Miller integration across Cm which is part of an AC regulation loop formed by Cm, EA and the power FET. As opposed to the previous method no HV circuitry is needed, and only Cm needs to be HV tolerant. However when the transition rate to be controlled gets relatively large (e.g. 500 mV/ns) designing a high bandwidth EA within a reasonable power budget and without producing undesirable steps, or discontinuities in the outputs is a challenging task. Dynamic biasing again requires complex pre-setting circuitry and a lot of adjustments. Stability with low currents and often very poorly defined capacitive loading is also a major challenge.

In summary, the prior art gate driver apparatus and methods have disadvantages. The circuits require high voltage (HV) circuitry. These high voltage circuits require significant silicon area, and consume more power, increasing the power budget. These circuits have unreliable and inaccurate output slope control. The circuits also limit the gate switching speed.

A new type of operation that is desirable includes an operation that enables reliable and accurate output slope control for MOSFETs driving inductive (or capacitive) load. A solution that allows fast gate switching is desired. A solution that does not utilize high voltage circuitry with lower power consumption and small area is desired. A circuit and method of fabrication that satisfies these requirements that does not introduce significant additional mask levels, additional cycle time, and cost is desired.

U.S. Pat. No. 7,595,624 to Tateishi et al., describes a control circuit that activates and deactivates at least one power switch to control a voltage of a switching node.

U.S. Pat. No. 7,425,819 to Isobe, shows a current mode switching regulator using slope compensation circuit. The circuit automatically accounts for different inductor values and varying input voltage voltages to generate a slope compensation signal. The slope compensation signal is generated based on the upslope signal.

U.S. Patent Application US 2006/0176031 to Forman et al., shows a switching circuit is provided that includes a charging switch configured to be connected to an inductor configured to receive control signals.

U.S. Pat. No. 7,443,148 B2 to Weng, titled shows a switching regulator using a minimum on-time variable off-time feedback control loop.

SUMMARY

It is desirable to provide a circuit which guarantees the accuracy of the output slope of a switching power FET.

It is desirable to provide a slope regulator circuit that has reduced complexity.

It is desirable to provide a switching power FET circuit with immunity to either input or output supply rail switching and coupling transients.

It is desirable to provide a switching power FET circuit and method that is resilient to supply and ground inductive bounces.

It is desirable to provide a switching power FET circuit with low static current consumption and very low dynamic power consumption.

It is desirable to provide a switching power FET slope regulator circuit that does not require high bandwidth error amplification.

A principal object of the present disclosure is to propose a method of switching a switching power FET circuit with ultra-fast operation, immunity to supply rail switching and ground inductive bounces, and low power consumption.

The above and other objects are achieved by a switching circuit comprising a high side (HS) switch coupled to an output, a low side (LS) switch comprising a power FET coupled to the output, a slope regulator analog core coupled to a gate of said low side (LS) switch, wherein said slope regulator analog core comprises a first AC loop and a second AC loop wherein said first AC loop is connected between said output and said gate, comprises a first capacitor, and is configured to integrate current across said first capacitor during a turn-on phase, and wherein said second AC loop is connected between said output and said gate, comprises a second capacitor, and is configured to integrate current across said second capacitor during a turn-off phase.

The above and other objects are also achieved by a method of providing a method of a switch circuit comprising the steps the first step, (a) providing a circuit comprising a low side (LS) switch, a high side (HS) switch, and a slope regulator wherein said slope regulator comprises a slope regulator mode, a second step (b) wherein said slope regulator comprises a first AC loop connected to an output and a gate of the device for which slope regulation is desired; and, a third step (c) providing a current to said first AC loop, controlled by a first Idac, in slope regulator mode.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which:

FIG. 18 is a method of operation of a circuit in accordance with a first embodiment of the disclosure.

DETAILED DESCRIPTION

Figure 1:
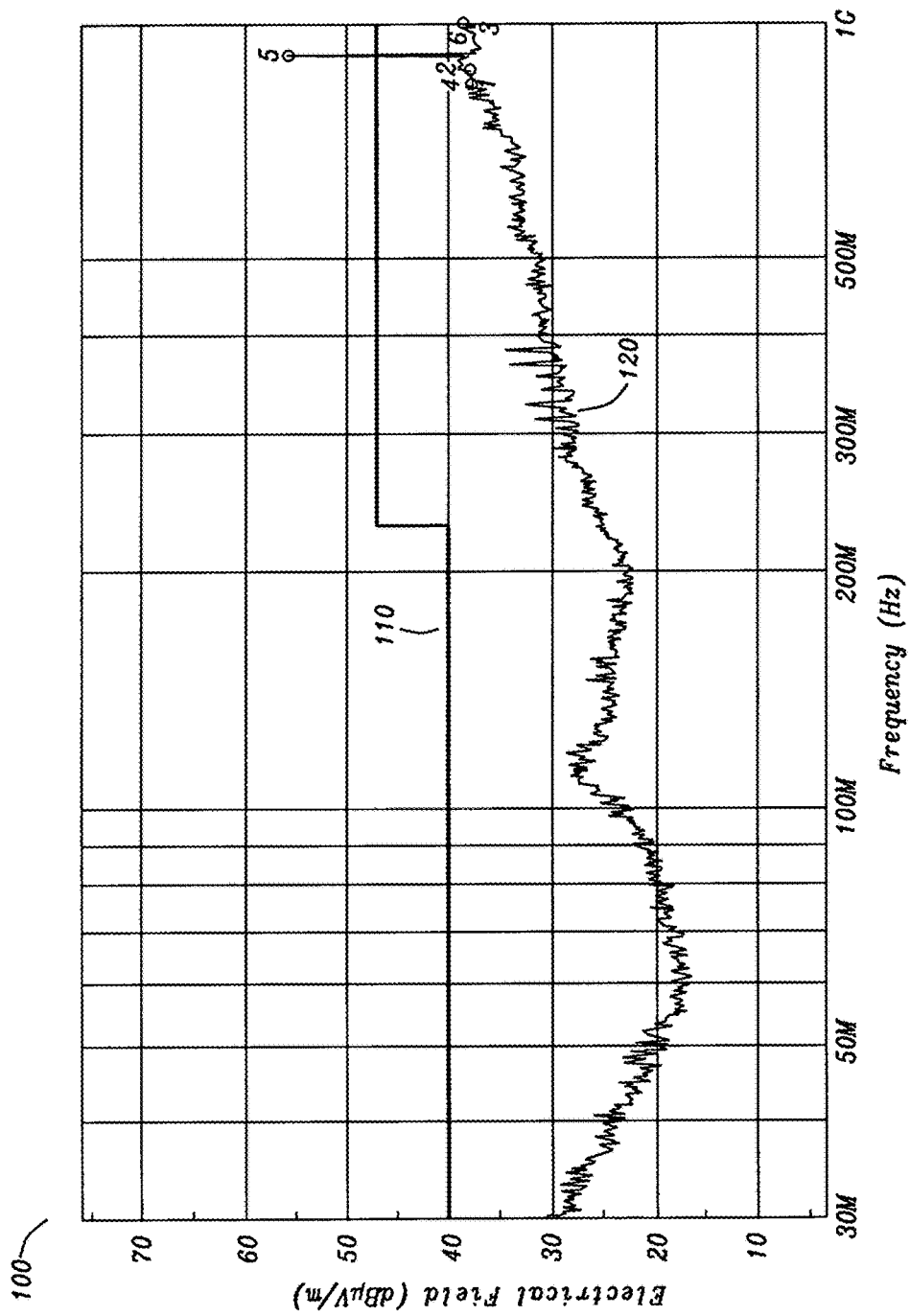
FIG. 1 is a plot of electrical field versus frequency.
Figure 2:
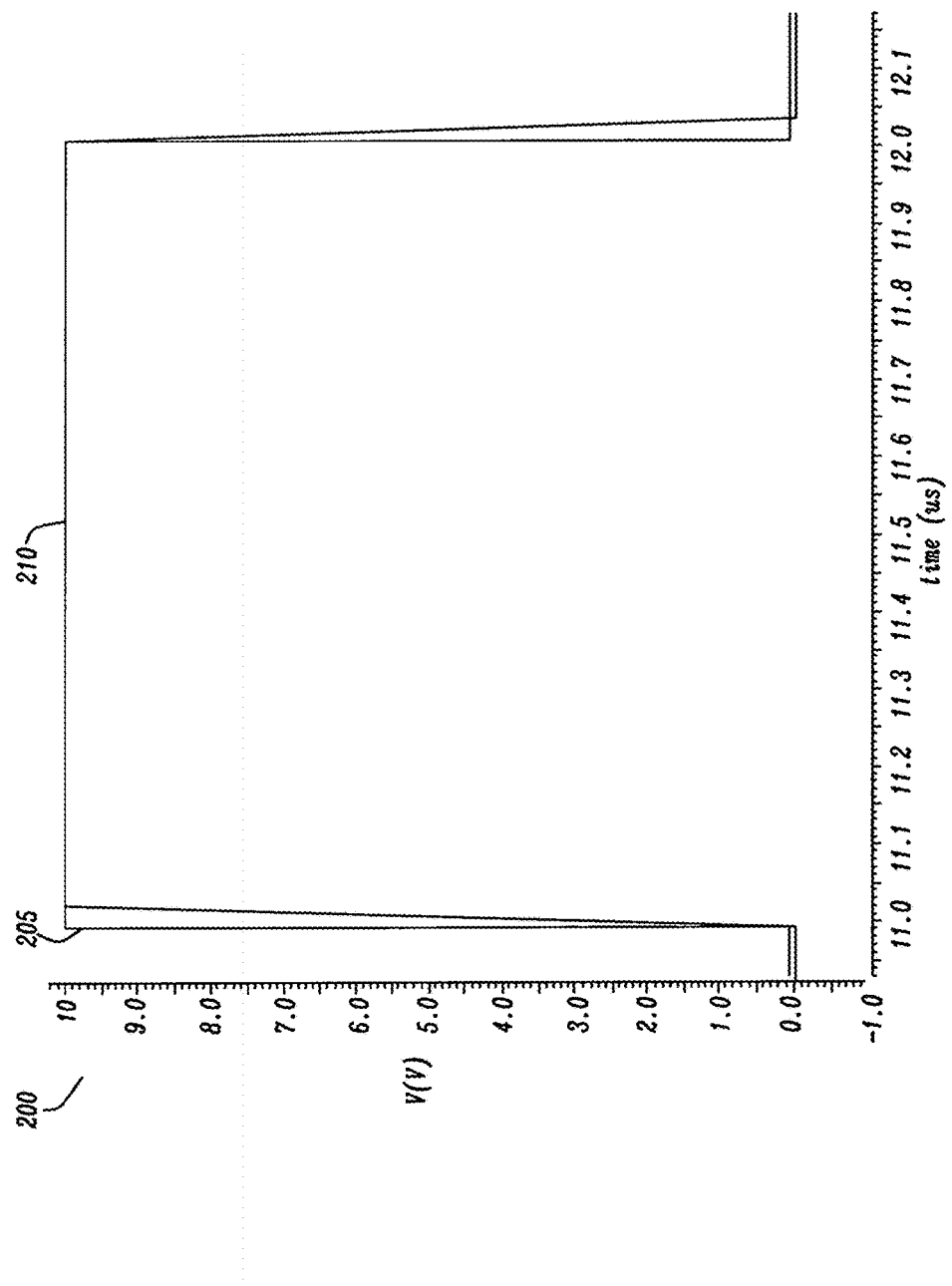
FIG. 2 is a plot of waveforms of a square pulse and trapezoidal pulse.
Figure 3:
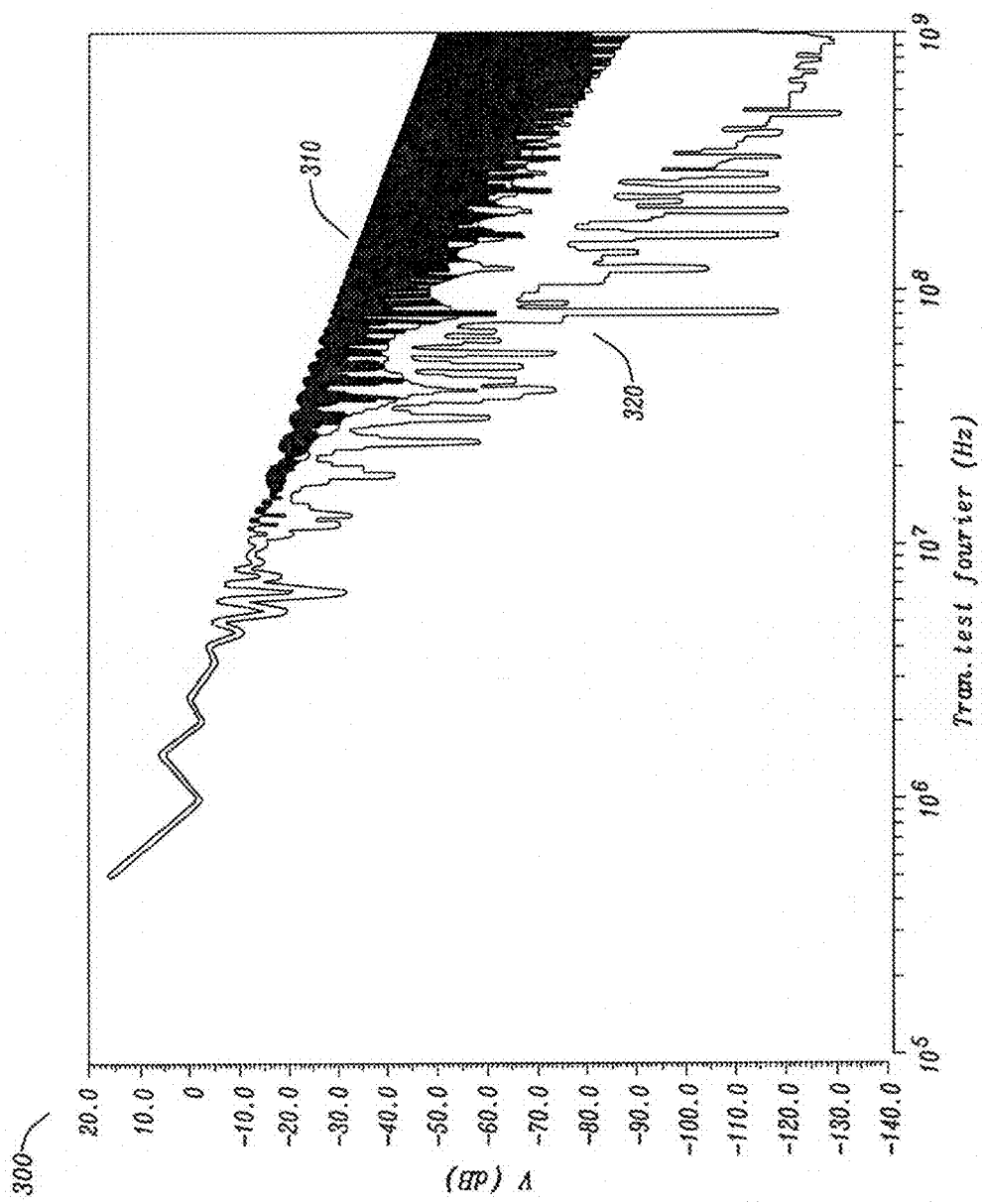
FIG. 3 is a plot of output harmonics versus frequency for a square pulse and trapezoidal pulse.
Figure 4:
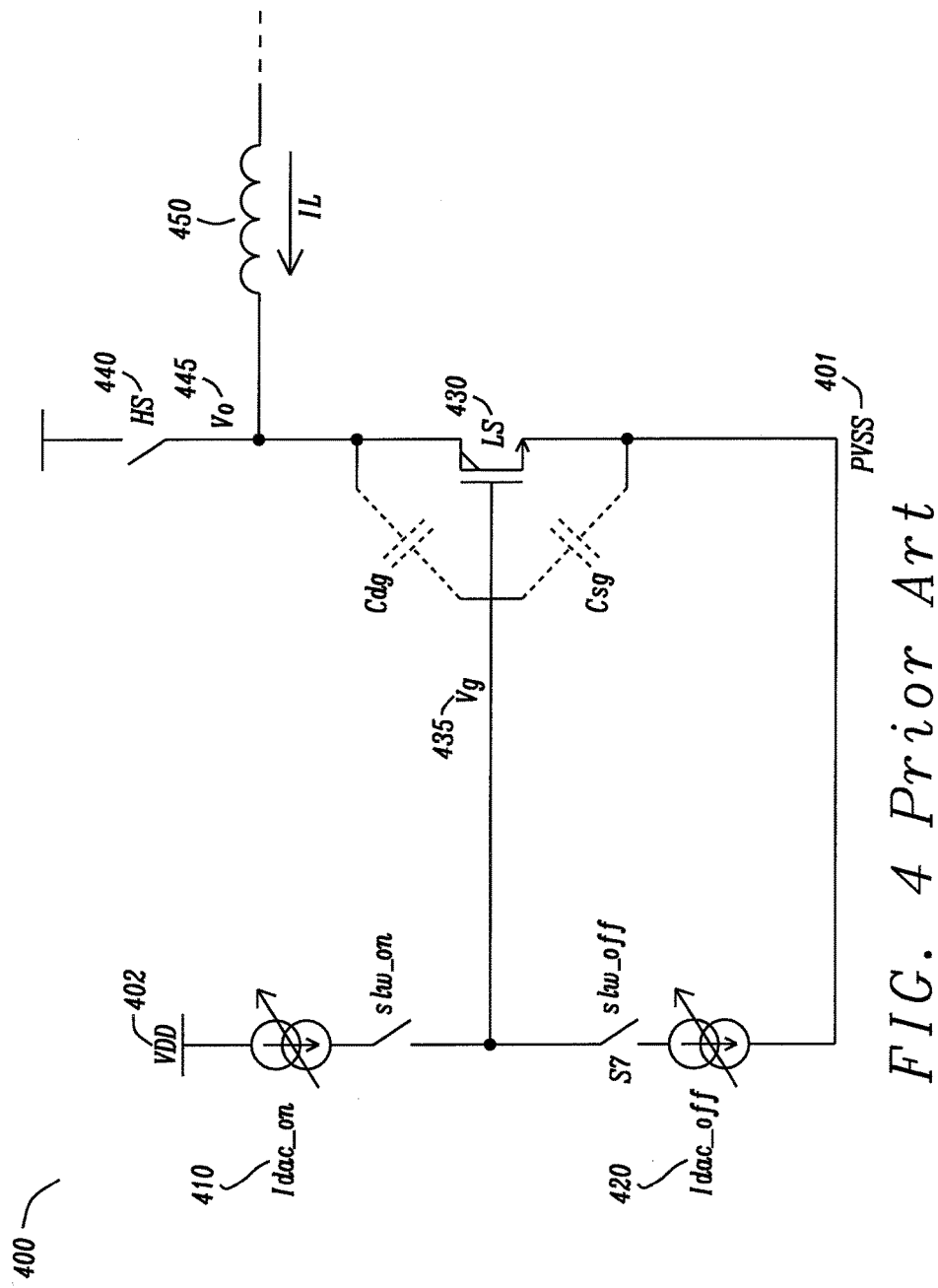
FIG. 4 is a circuit schematic of a power FET circuit illustrating a prior art embodiment that is known to the inventors.
Figure 5:
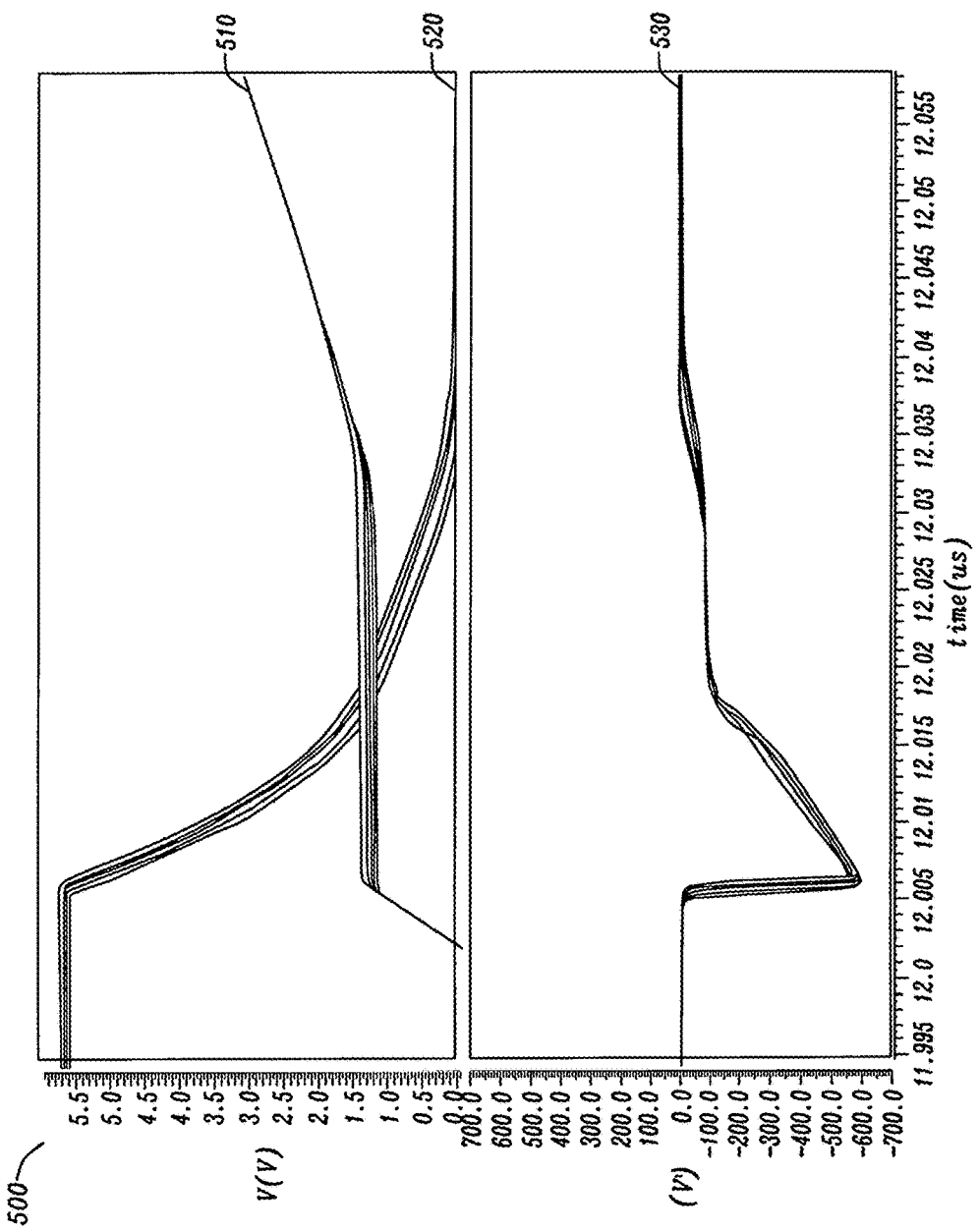
FIG. 5 illustrates output characteristics of a power FET circuit illustrating a prior art circuit known the inventors.
Figure 6:
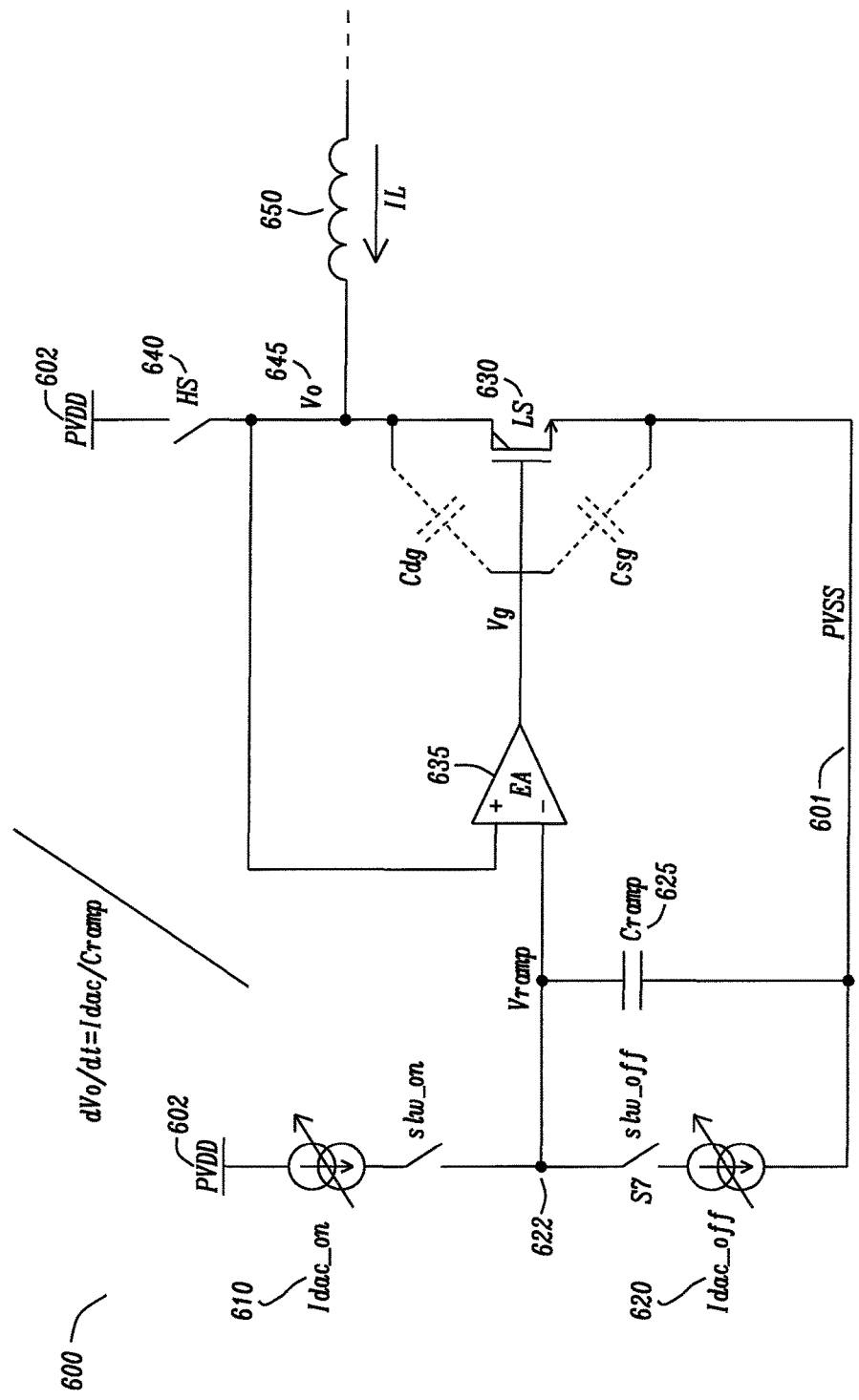
FIG. 6 is a circuit schematic of a power FET illustrates a circuit of a second prior art embodiment that is known to the inventors.
Figure 7:
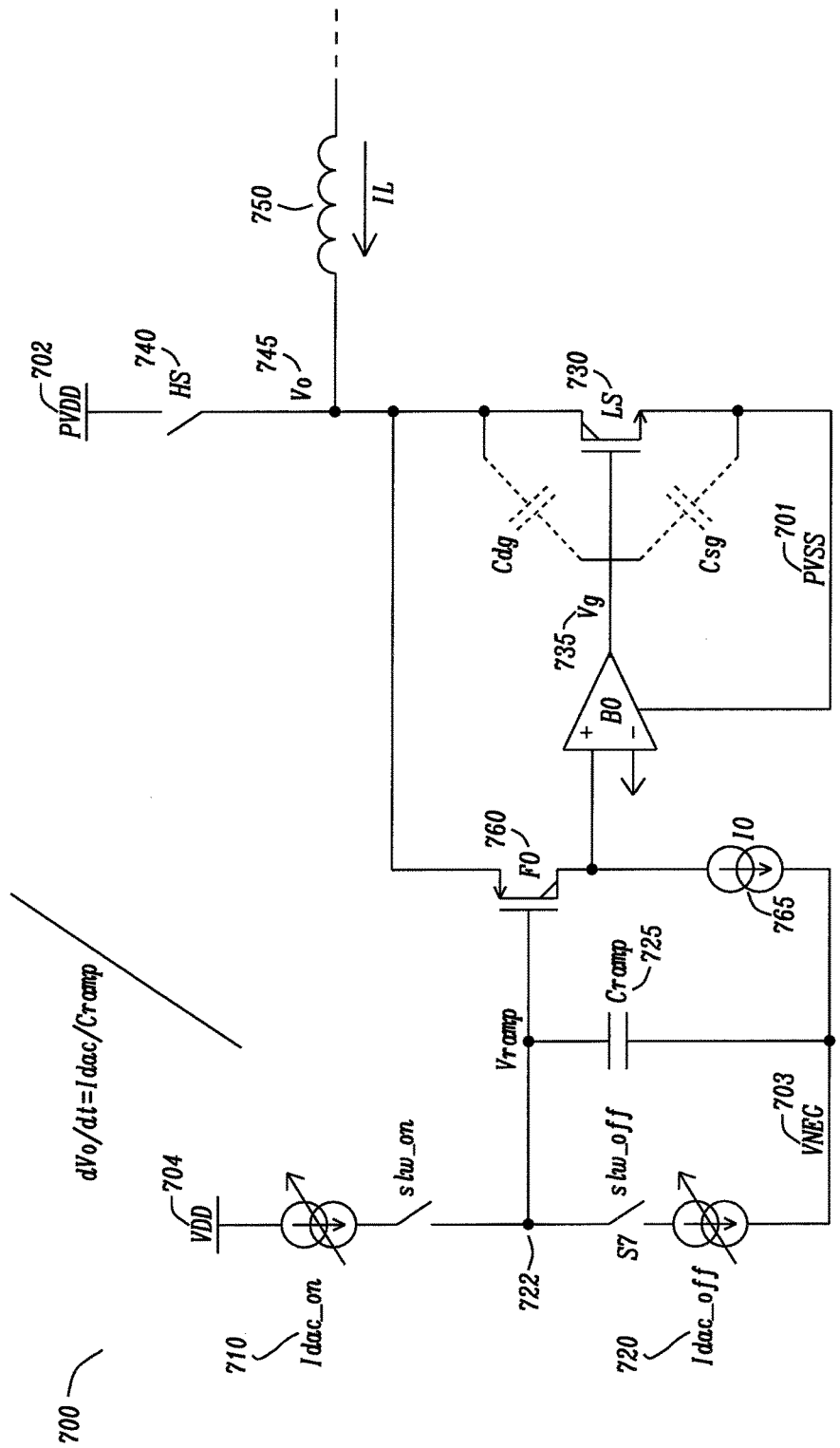
FIG. 7 is a circuit schematic of a power FET illustrates a circuit of a variant of the second prior art embodiment that is known to the inventors.
Figure 8:
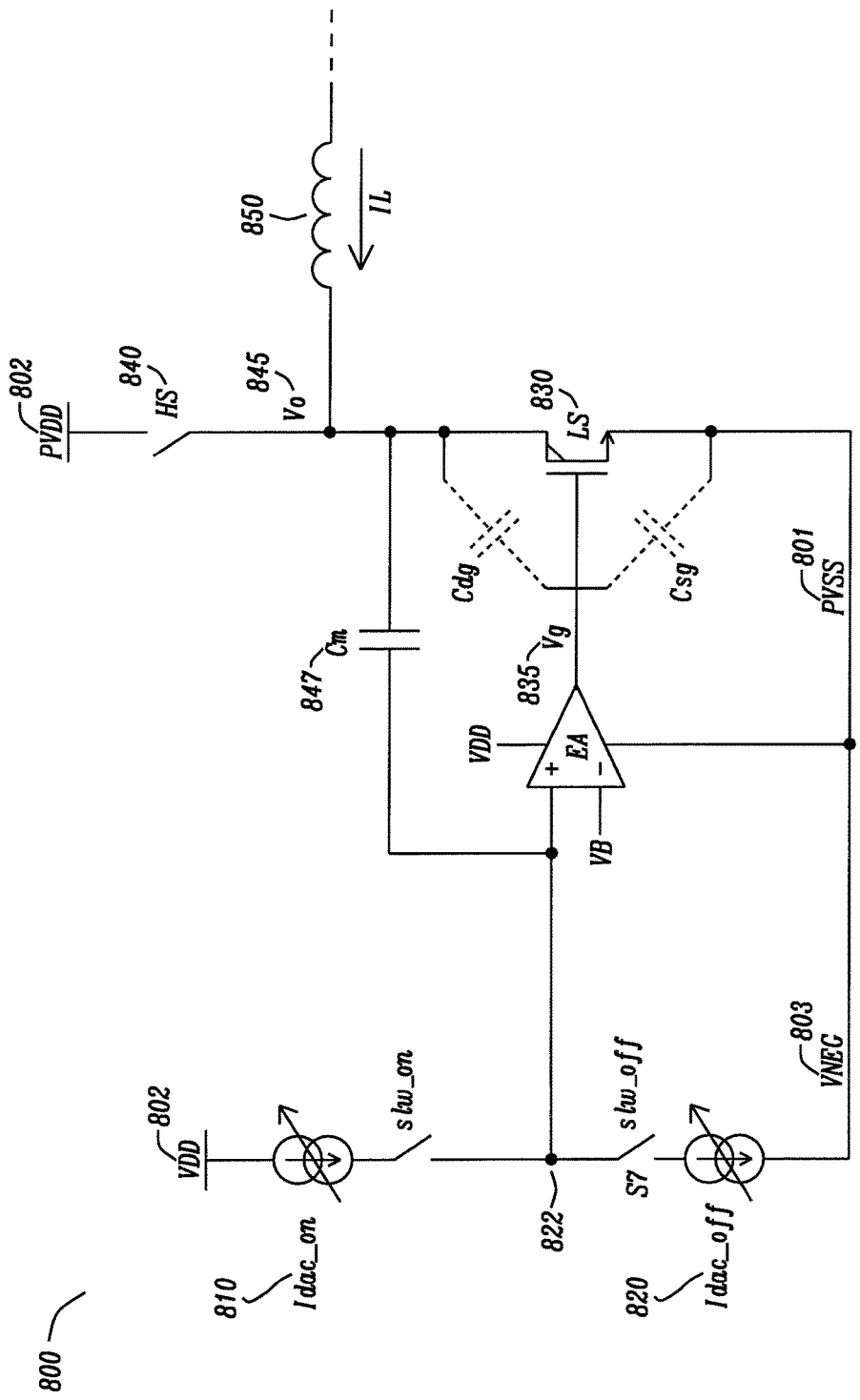
FIG. 8 is a circuit schematic of a power FET illustrates a circuit of a third prior art embodiment that is known to the inventors.
Figure 9:
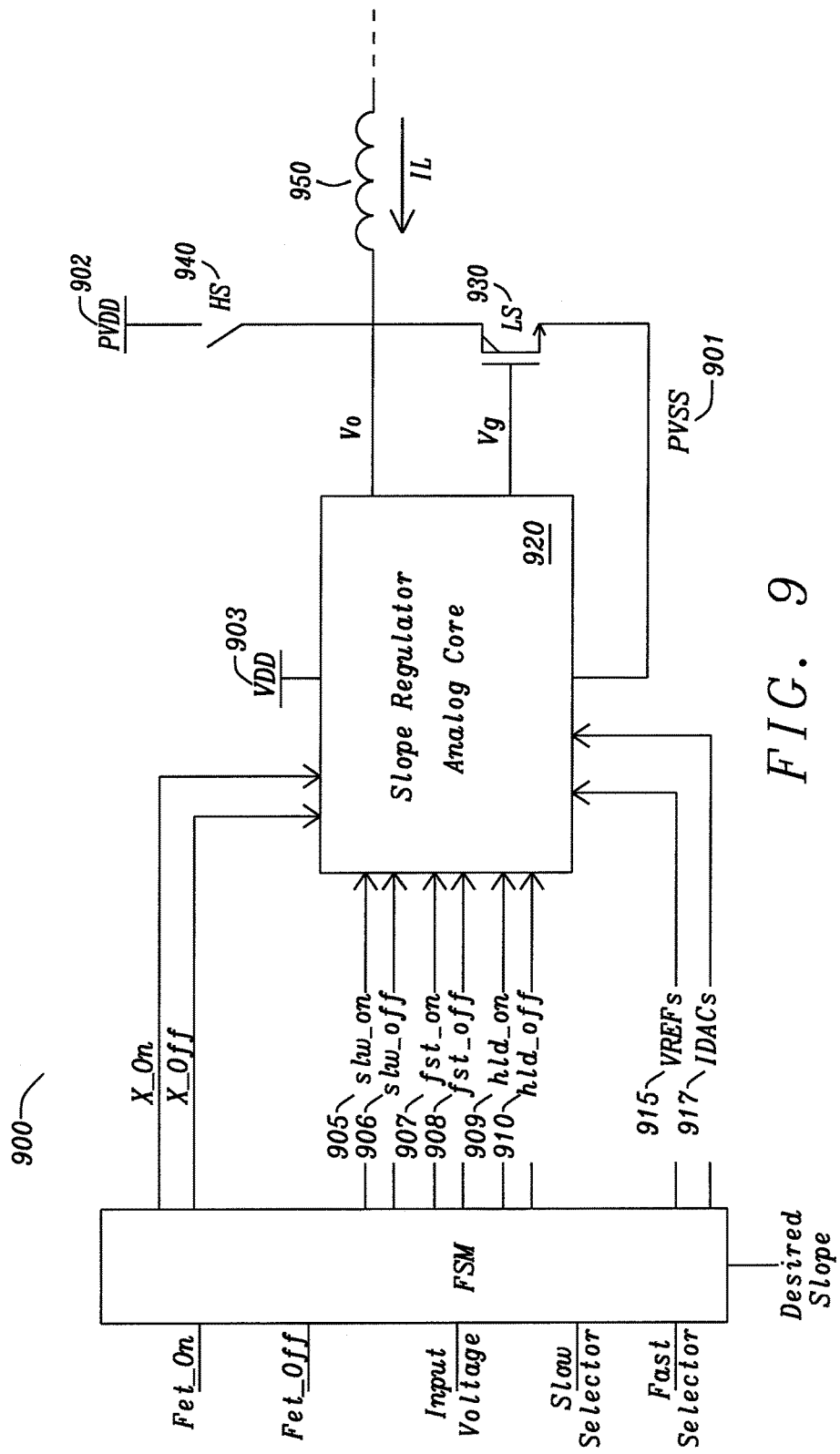
FIG. 9 is a circuit highlighting a high level diagram of a slope regulator analog core in accordance with a first embodiment of the disclosure.

FIG. 9 is a circuit 900 highlighting a high level diagram of a slope regulator for a switching power FET circuit in accordance with a first embodiment of the disclosure, including a power supply PVDD 902 and ground PVSS 901. The switching power FET circuit of the disclosure may be used at an output node of, for example, a Class D amplifier, or a DC-DC switching regulator. The high side switch 940 is electrically connected to PVDD 902 and output Vo, and the low side switch 930 is connected to PVSS 901. The Slope Regulator Analog Core 920 has control signal inputs slw_on 905, slw_off 906, fst_on 907, fst_off 908, hld_on 909, hid 910, as well as voltage references (VREF) 915, and IDACs 917. The output of the Slope Regulator Core 920 is output voltage Vo, and gate voltage Vg. The output voltage is coupled to the inductor 950, and gate voltage Vg is coupled power MOSFET LS 930. The slope regulator for the low side power FET (see FIG. 9) receives logic control signals from a Finite State Machine (FSM) that decides whether the gate should be switched in fast mode (using signals fst_on/fst_off) or in slope regulation mode (using signals slw_on/slw_off). Once the transition is finished another pair of control signals (hld_on/hld_off) is toggled, depending on the polarity, to hold either the gate in low state or in high state. The signal x-on is active when either the signals slw_on or fst_on are active, and these are controlling signals on the forward path. The signal x-off is active when either of the signals slw_off or fst_off are active, and these are also the controlling signals for the forward path. The signal fet-off is a status signal sensing that the FET has effectively turned off Additionally, the signal fet-on is a status signal sensing that the FET has turned on. Sensing gate circuitry, as is known in the art, is used to sense the status of the power FET. The signals fet_off and fet_on are generated from gate sensors. The signal fet_off goes to logic high when the gate voltage is close to zero and signal fet_on toggles to logic high when the gate voltage goes close to VDD. The FSM is using the signal fet_off and fet_on as logic inputs to control its own state transitions. These signals fet-off and fet_on are fed back to the FSM (as inputs) where they are used to determine state transitions.

Figure 10:
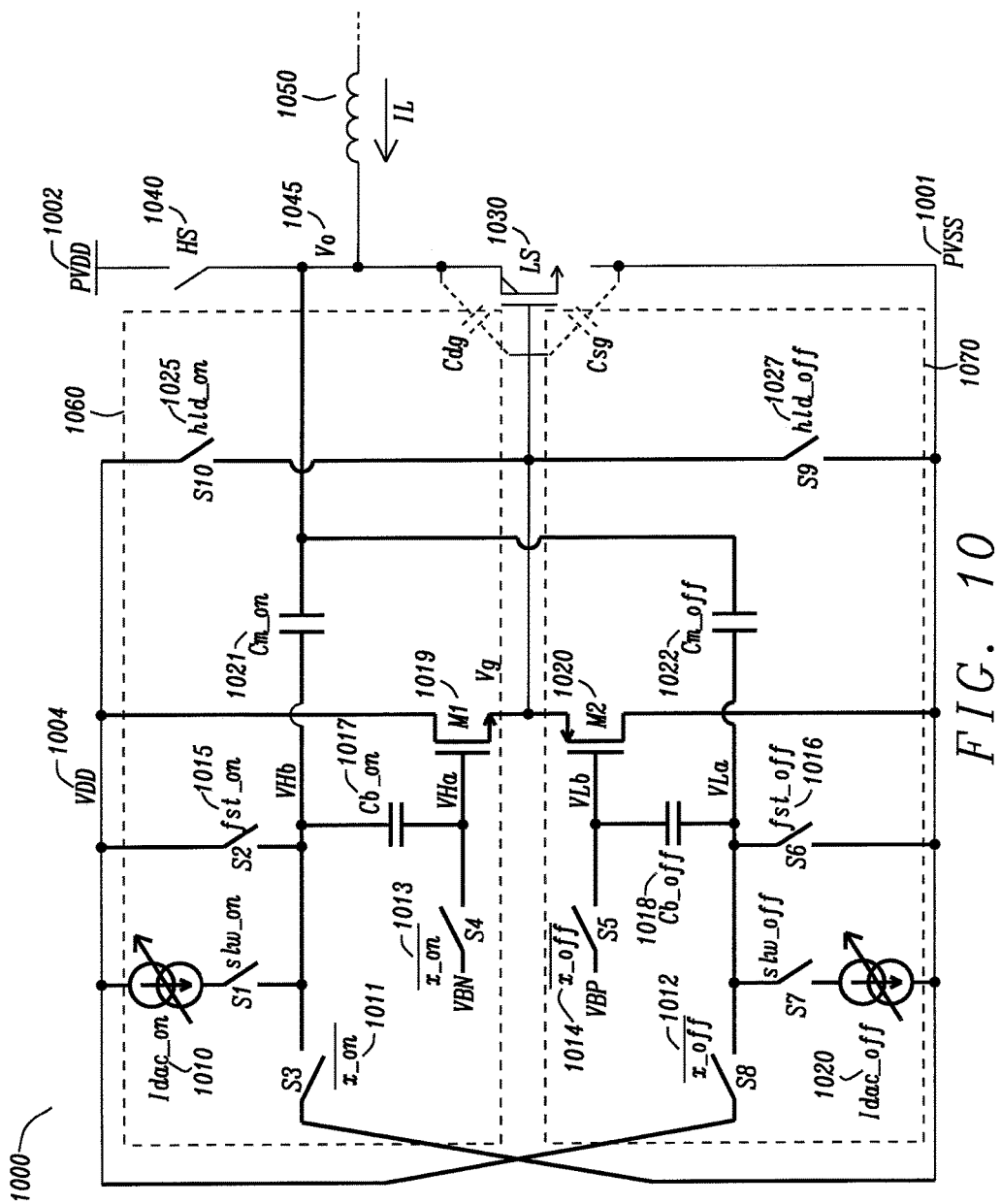
FIG. 10 is a circuit in accordance with a first embodiment of the disclosure.

FIG. 10 is a circuit in accordance with a first embodiment of the disclosure. The circuit 1000 illustrates details of the Slope Regulator Analog Core 920, and is connected to power supply PVDD 1002 and ground PVSS 1001. The high side switch 1040 is electrically connected to PVDD 1002 and output Vo, and the low side switch 1030 is connected PVSS 1001. The high side (HS) switch 1040 drain and low side (LS) switch 1030 drain are coupled to the inductor 1050. The circuit shown in FIG. 10 applies dual integration using Cm_on 1021 and Cm_off 1022 capacitors as part of two controlling local loops. A first AC loop 1060 includes the "on" state capacitor Cm_on 1021, as well as capacitor Cb_on, switch S4, and NMOS transistor M1 1019. A second AC loop 1070 includes the "off" state capacitor Cm_off 1022, as well as capacitor Cb_off 1018, switch S5, and NMOS transistor M2 1020.

The power supply VDD 1004 is coupled to switch S8 1012. The ground PVSS 1001 is coupled to switch S3 1011. The switch S3 1011 is coupled to switch S1, and S1 is coupled to the current source Idac_on 1010. The switch S8 1012 is coupled to switch S7, which is coupled to the current source Idac_off 1020. The switch S2 1015 is coupled to power supply VDD 1004. The switch S6 1016 is coupled to power supply PVSS 1001.

Bias voltage VBN is coupled to a switch S4 1013 and the gate of transistor M1 1019, and capacitor Cb_on 1017. Bias voltage VBP is coupled to a switch S5 1014 and the gate of transistor M2 1020, and capacitor Cb_off 1018. Capacitors Cm_on 1021, and Cm_off 1022 are coupled to output voltage 1045 Vo. VBN and VBP are used as pre-biasing voltages respectively for capacitors Cb_on and Cb_off. The first AC loop is associated with a turn on phase; it is formed by the Cm_on, Cb_on and M1. The second AC loop is associated with a turn off phase, it is formed by the same output device, Cm_off 1022, Cb_off 1018 and M2 1020. VBN & VBP are voltage references referred respectively to PVSS 1001 and VDD 1004, and ideally they should be a VGS drop from the relevant supplies.

Figure 11:
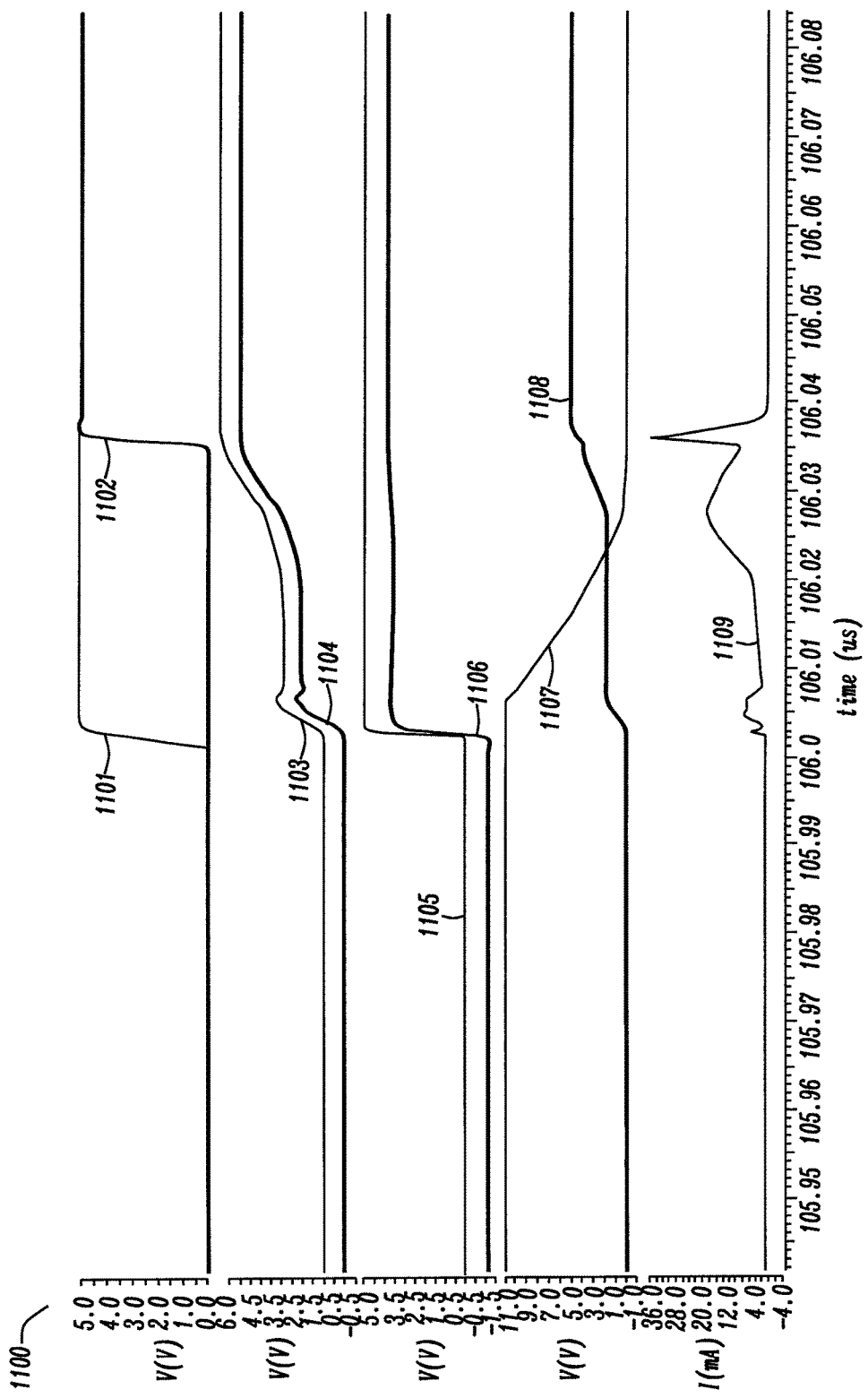
FIG. 11 is a diagram of the circuit typical waveforms of regulated slope turn-on in accordance with a first embodiment.

FIG. 11 is a diagram of the circuit typical waveforms of regulated slope turn-on in accordance with a first embodiment. The signals consist of slw_on 1101, fet_on 1102, VHa 1103, VHb 1104, VLa 1105, VLb 1106, gate voltage Vg 1107, output voltage Vo 1108, and gate current Ig 1109. When the device is turned off switch S4 is closed and Cb_on can accumulate a positive VBN drop in order to act as a voltage source during the next turn-on phase. Similarly when the device is turned on switch S5 is closed and Cb_off can accumulate a negative VBP drop in order to act as a voltage source during the next turn_off phase. Note that VHa and VHb are acting both as integration nodes during the transition and charging node of the switched capacitors. At any time only one Idac is enabled with current being integrated across either Cm_on during turn ON or Cm_off during turn off, with the two integration capacitors operating in an interleaved fashion. The slope controlled turn-on transition is initiated by 'slw_on', Ig represents the FET input current, 'Vo' represents the regulated output. S1, S5 and S8 are closed, the transition ends after 'fet_on' is asserted. Note the smooth and controlled slope of the output voltage 1108 during the transition shown in FIG. 11.

Figure 12:
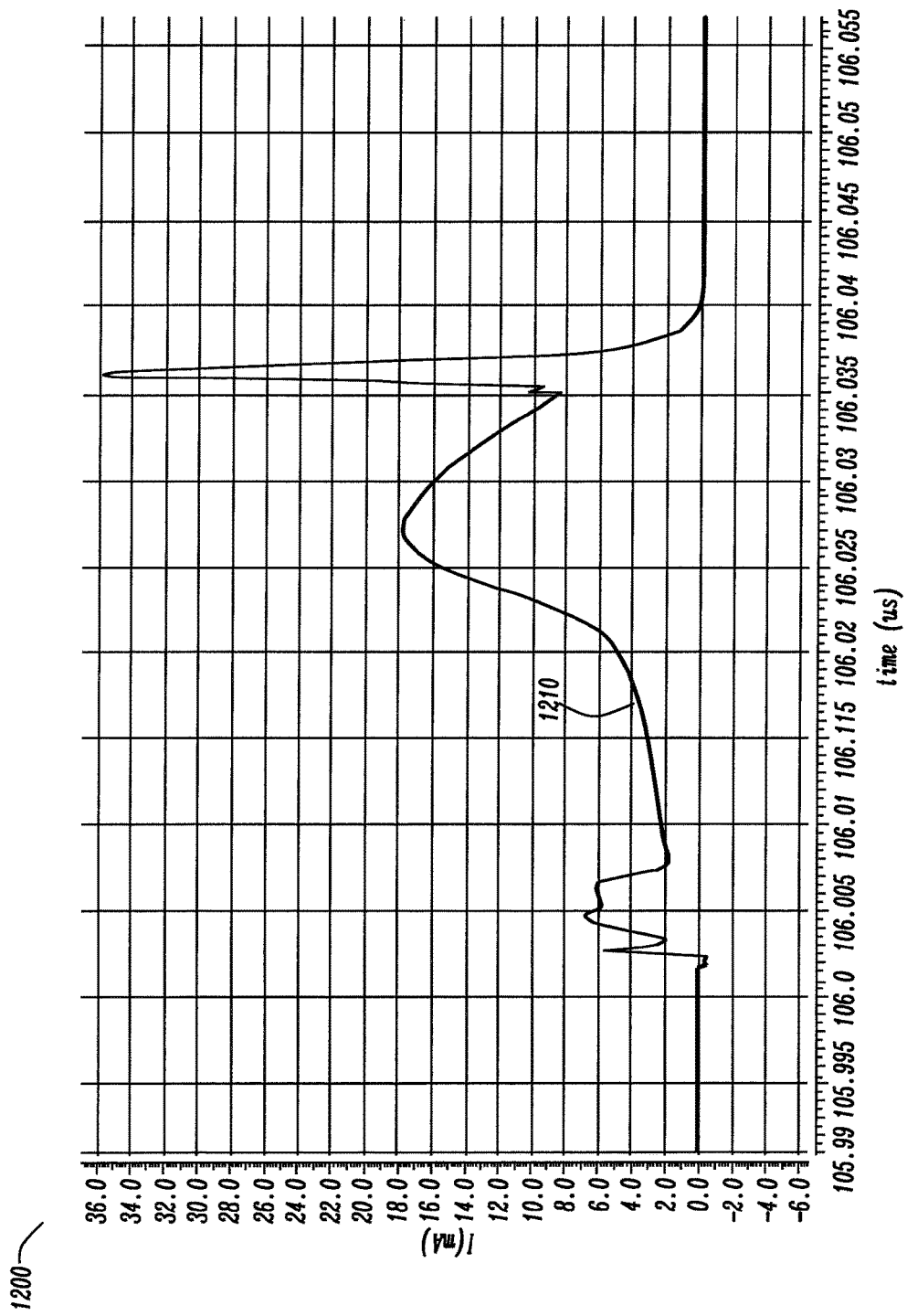
FIG. 12 is a diagram of the circuit typical waveform of the gate current in accordance with a first embodiment.

FIG. 12 is a diagram of the circuit typical waveform of the gate current 1210 (also shown in FIG. 11 as 1108) in accordance with a first embodiment. FIG. 11 and FIG. 12 demonstrate the wide variation of gate current during the transition. In the triode region and before the final boost of current following 'fet_on', the current jumps from a few mA to almost 18 mA.

Figure 13:
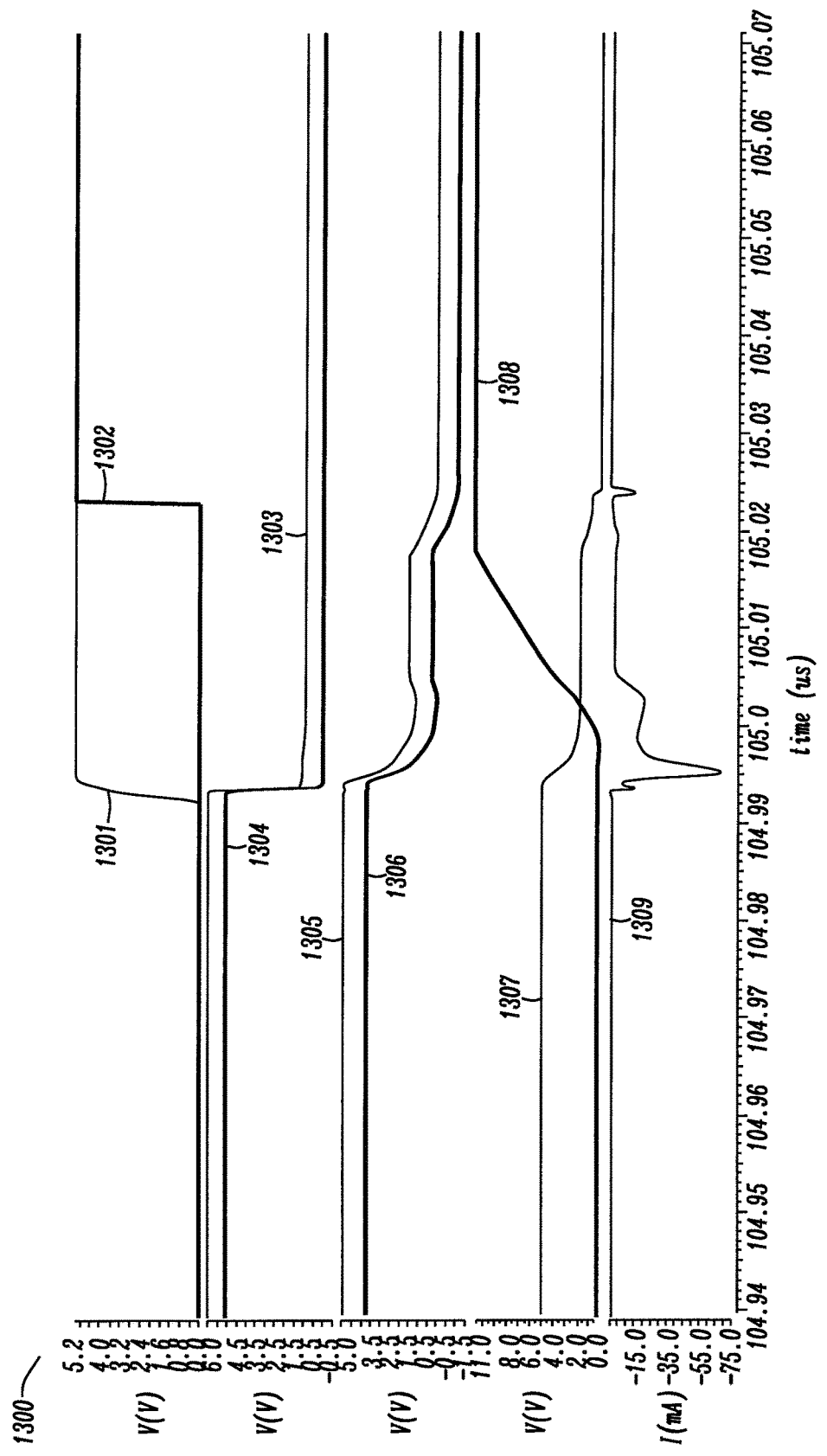
FIG. 13 is a diagram of the circuit typical waveforms of regulated slope turn-off in accordance with a first embodiment.
Figure 14:
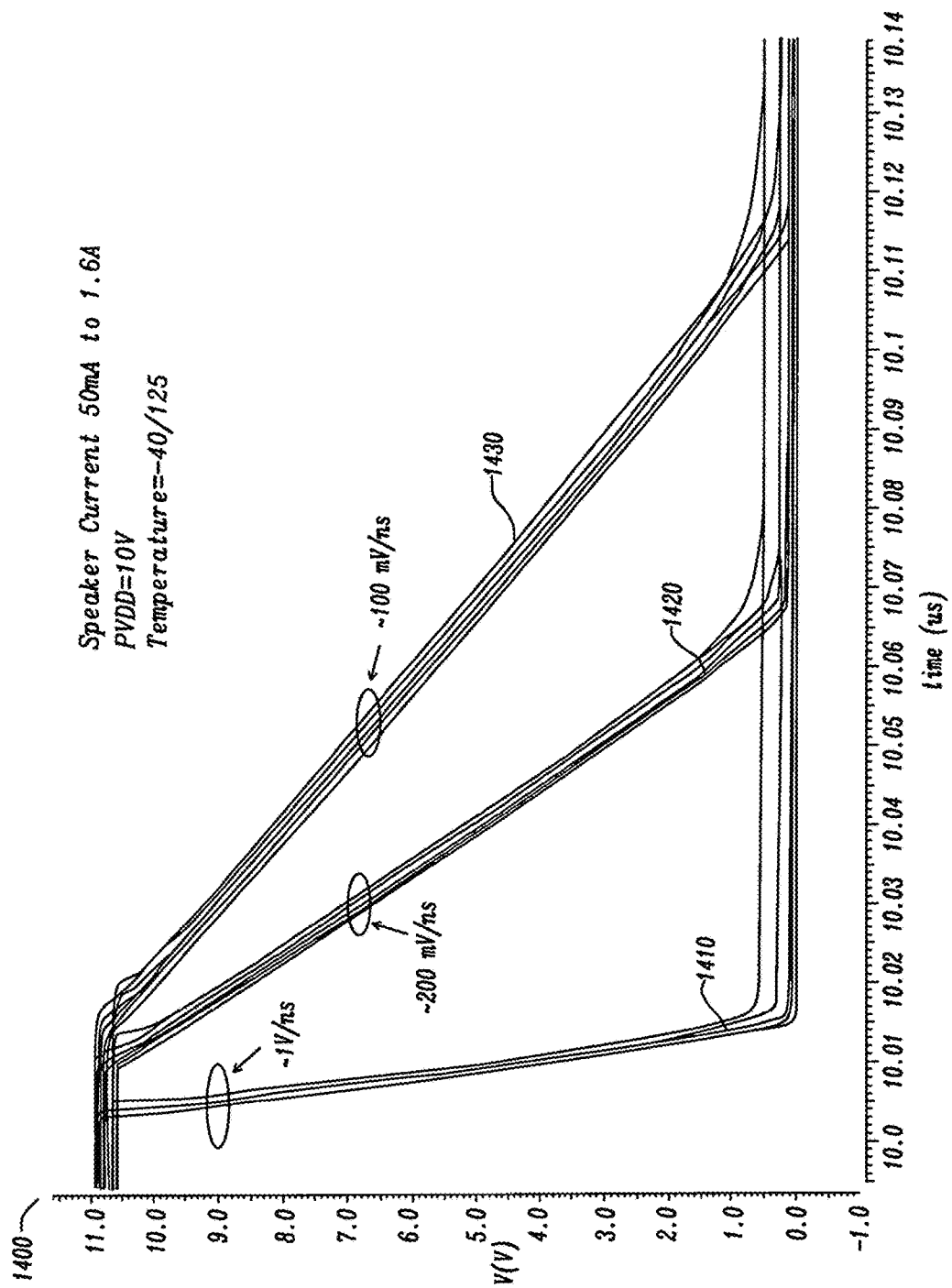
FIG. 14 is a diagram of the circuit output signal on low side turn-on across process corners in accordance with a first embodiment.

FIG. 13 is a diagram of the circuit typical waveforms of regulated slope turn-off in accordance with the first embodiment. The signals 1300 consist of slw_off 1301, fet_off 1302, VHa 1303, VHb 1304, VLa 1306, VLb 1305, gate voltage Vg 1308, output voltage Vo 1307, and gate current Ig 1309. The slope controlled turn-off transition is initiated by 'slw_off', Ig represents the FET input current, 'Vo' represents the regulated output. S3, S4 and S7 are closed; the transition ends after 'fet_off' is asserted FIG. 14 is a diagram of the circuit output voltage on low side turn-on across process corners 1400 in accordance with a first embodiment. The output waveforms shown have differing slopes 1 V/ns 1410, 200 mV/ns 1420, and 100 mV/ns 1430. Programmable current sources Idac_on and Idac_off used to create the variable output voltage slopes shown.

Figure 15:
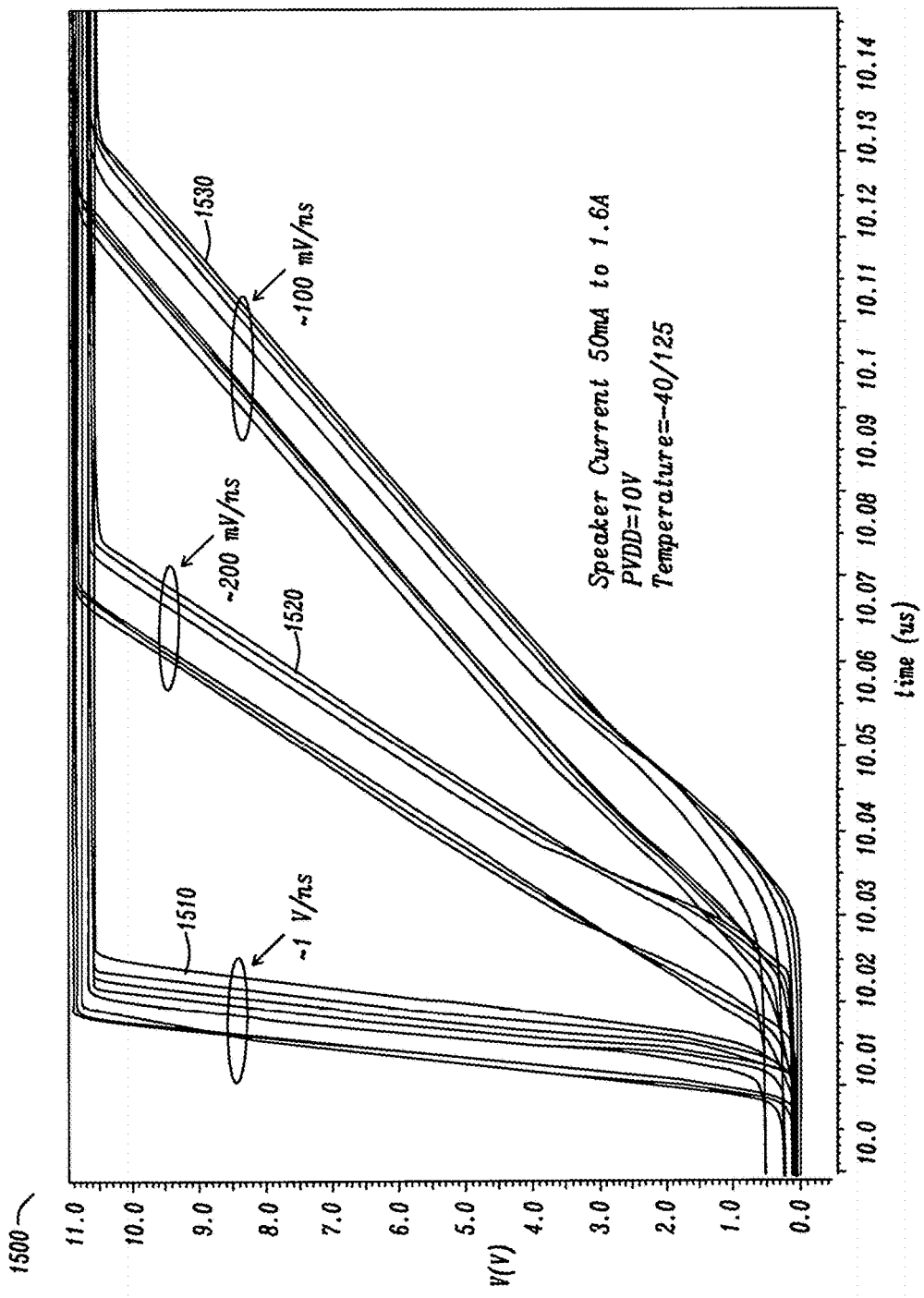
FIG. 15 is a diagram of the circuit output signal on low side turn-off across process corners in accordance with a first embodiment.

FIG. 15 is a diagram of the circuit output voltage on low side turn-off across process corners in accordance with a first embodiment. The signal are at 1 V/ns 1510, 200 mV/ns 1520, and 100 mV/ns 1530.

Figure 16:
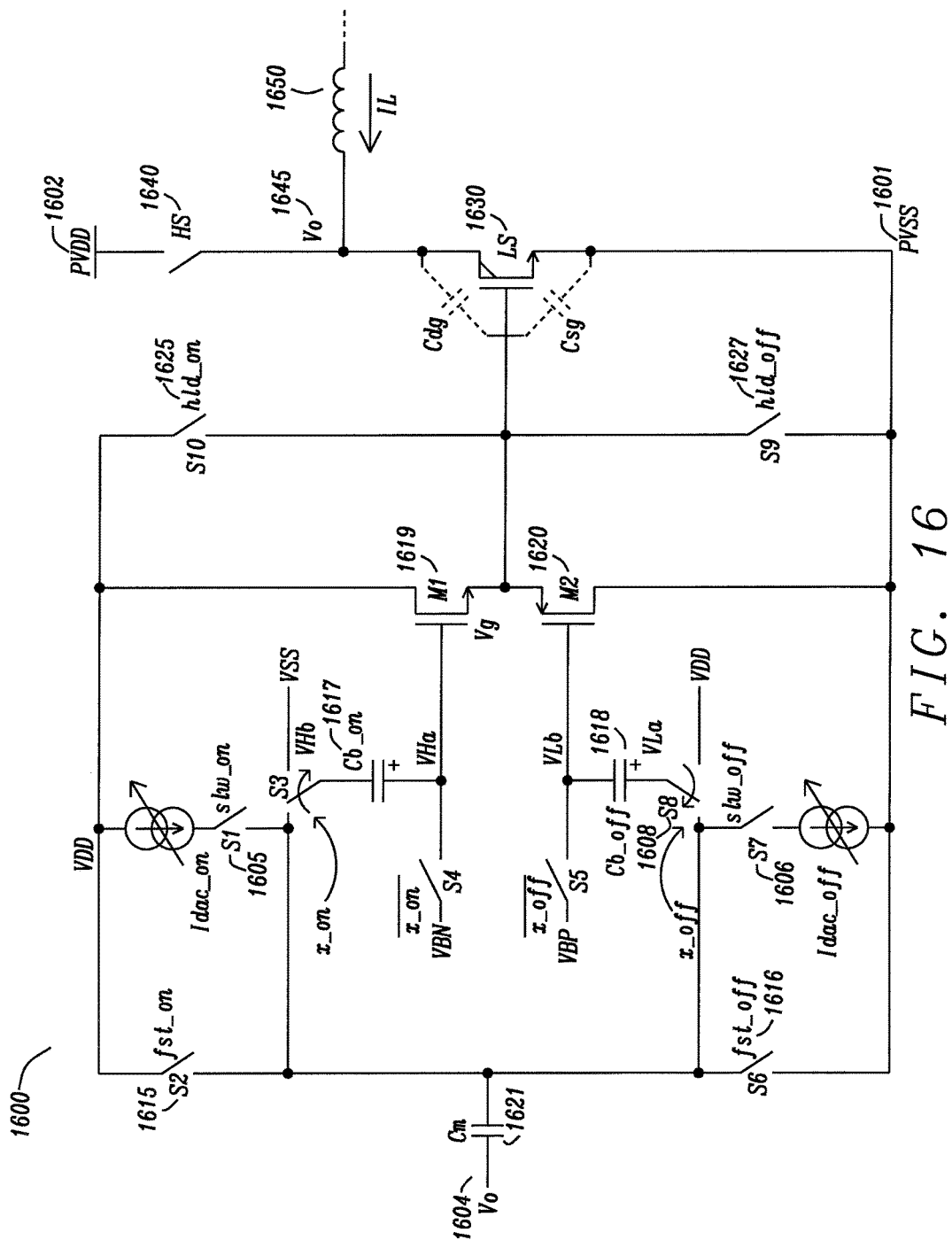
FIG. 16 is a circuit in accordance with a second embodiment of the disclosure; and, FIG. 17 is a timing diagram in accordance with a first embodiment of the disclosure.

FIG. 16 is a circuit in accordance with a second embodiment of the disclosure. FIG. 16 is a circuit schematic with only one integration node, and capacitor Cm 1621, illustrating the details of the Slope Regulator Analog Core of FIG. 9. The power rails include power supply VDD 1603 and PVDD 1602 and ground PVSS 1601. The high side (HS) switch 1640 is electrically connected to PVDD 1602 and output Vo 1604, and the low side (LS) switch 1630 is connected to PVSS 1601. The high side (HS) switch 1640 source and low side (LS) switch 1630 drain are coupled to the inductor 1650. The current source Idac_on and slw_on S1 switch 1605 and fst_on switch S2 1615 are coupled to VDD 1603. The current source Idac_off and slw_off switch S7 1606 and fst_off switch S6 1616 are coupled to PVSS 1601. X_on switch S3 1607 toggles between VSS and capacitor CM 1621. X_off switch S8 1608 toggles between VDD and capacitor CM 1621. The capacitor Cb_on 1617 and capacitor Cb_off 1618 are coupled to gates of NMOS transistor M1 1619 and PMOS transistor M2 1620, respectively. In contrast, the disclosed circuit shown in FIG. 10 applies dual integration using Cm_on 1021 and Cm_off 1022 capacitors, as part of two controlling local loops.

An example of the switching sequence for the single integration node embodiment of FIG. 16 is described below. The switching sequence is as follows:

In the power FET off state capacitor Cb_on is getting charged from VBN-VSS, since switch S4 is closed and switch S3 is toggled to connect to VSS. Hld_off switch S9 is closed to hold the power FET in an off state.

If a slow turn on is requested (slw_on=1), capacitor Cb_off will get pre-charged to VDD-VBP since is switch S8 is toggled to connect to VDD, and switch S5 is closed. Also switch S1 will be closed to allow idac-on current to flow into capacitor Cm. At the end of the turn on phase, hld_on switch S10 will be closed to maintain the on state.

Figure 17:
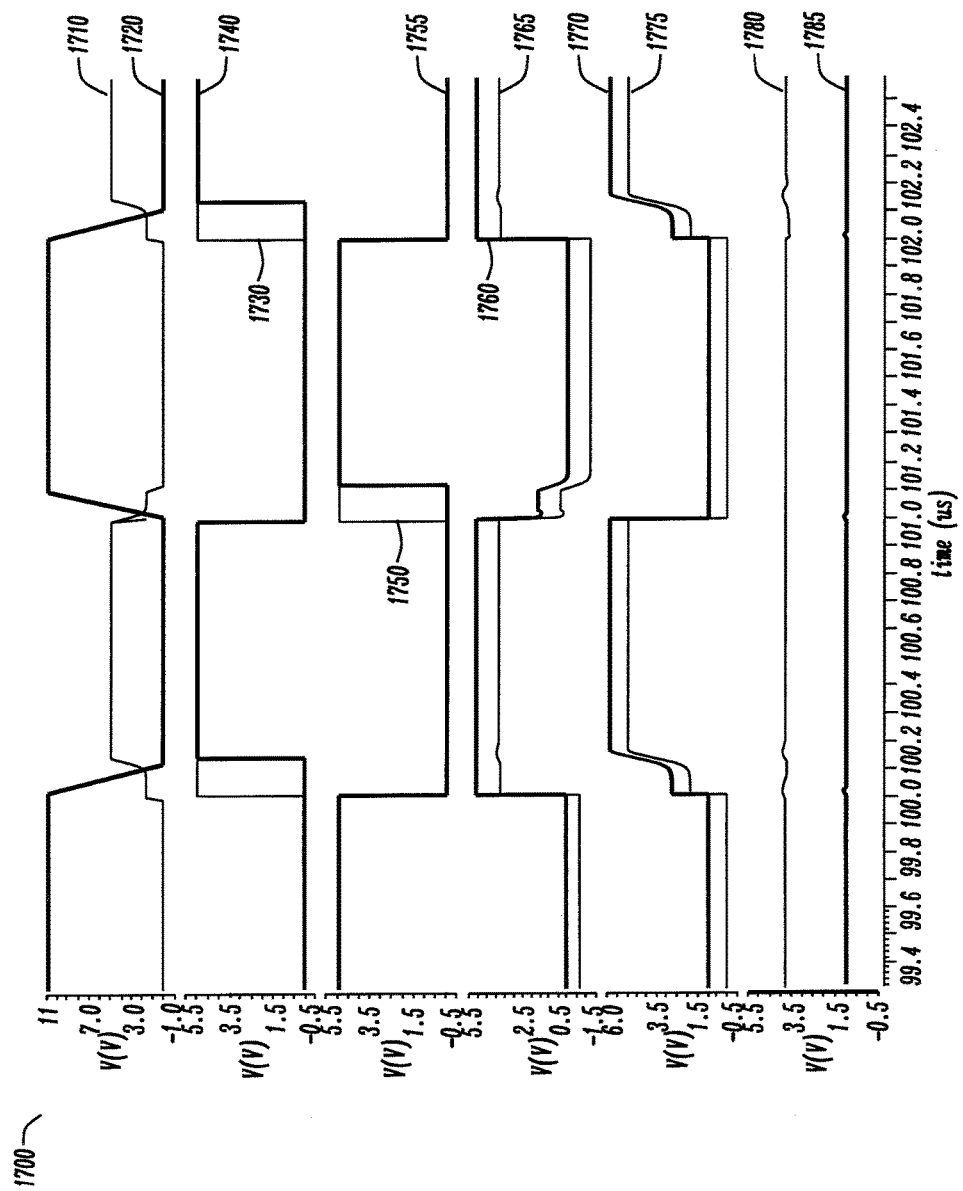

If a slow turn off is requested (slw_off=1), capacitor Cb_on will get pre-charged to VBN-VSS since switch S3 is toggled to connect to VSS, and S4 is closed. Also switch S7 will be closed to allow idac-off current to flow into capacitor Cm. At the end of the turn off phase, hld_off switch S9 will be closed to maintain the off state FIG. 17 illustrates a timing diagram 1700 in accordance with a first embodiment of the disclosure. Signals shown in the timing diagram 1700 of output voltage Vo 1710, gate voltage Vg 1720, on conditions slw_on 1730 and hld_on 1740, as well as off states hld_off 1755, and slw_off 1750. Timing signals are also shown for voltage states VLa 1760, VLb 1765, VHa 1770, VHb 1775, and bias voltages VBP 1780, and VBN 1785. As can be seen, the "slow" on and off signals are initiated, changing the output voltage Vo with a regulated slope. Once the output voltage change is complete, the "hold" signal is initiated and the switch is held in the same position as the "slow" switch until the next transition.

FIG. 18 is a method of operation of a circuit in accordance with a first embodiment of the disclosure. A method of a circuit comprising the steps of a first step 1810 (a) providing a circuit comprising a low side (LS) switch, a high side (HS) switch, and a slope regulator wherein said slope regulator comprises a slope regulator mode, a second step 1820 (b) wherein said slope regulator comprises a first AC loop connected to an output and a gate of the device for which slope regulation is desired; and, a third step 1830, (c) providing a current to said first AC loop, controlled by a first Idac, in slope regulator mode.

It is understood that the disclosure can be utilized with either a high side (HS) or low side (LS) switch with proper MOS type and proper polarities. For example, it is understood that the objective of the disclosure can be achieved to regulate the output slope of a PMOS device for the high side (HS) switch.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A switching circuit comprising:
   a high side (HS) switch coupled to an output;
   a low side (LS) switch comprising a power FET coupled to the output;
   a slope regulator analog core coupled to a gate of said low side (LS) switch, wherein said slope regulator analog core comprises a first AC loop and a second AC loop;
   a slope regulation mode accomplished by connecting each of said first and second AC loops to first and second current digital-to-analog-converters, respectively, in an interleaved manner;
   wherein said first AC loop is connected between said output and said gate, comprises a first capacitor, and is configured to integrate current across said first capacitor during a turn-on phase; and
   wherein said second AC loop is connected between said output and said gate, comprises a second capacitor, and is configured to integrate current across said second capacitor during a turn-off phase.

2. The switching circuit of claim 1, further comprising a fast mode accomplished by connecting one of said first or second AC loops to a power or ground rail.

3. The switch circuit of claim 1, further comprising a hold control mode accomplished by connecting said gate to power or ground rails after said turn-on phase or said turn-off phase is complete; wherein said first AC loop further comprises an NMOS device having its source connected to said gate of said low side switch, its drain connected to a power rail, and its gate connected to an input switch.

4. The switch circuit of claim 3, further comprising a second capacitor connected between said gate of said NMOS device and said first capacitor, and wherein said input switch is connected to a voltage reference.

5. The switch circuit of claim 1, wherein said first AC loop further comprises an NMOS device having its source connected to said gate of said low side switch, its drain connected to a power rail, and its gate connected to an input switch.

6. The switch circuit of claim 1, wherein said second AC loop further comprises an PMOS device having its drain connected to said gate of said low side switch, its source connected to a ground rail, and its gate connected to an input switch.

7. The switch circuit of claim 6, further comprising a second capacitor connected between said gate of said PMOS device and said first capacitor, and wherein said input switch is connected to a voltage reference.

8. A switching circuit comprising:
   a high side (HS) switch coupled to an output;
   a low side (LS) switch comprising a power FET coupled to the output;
   a slope regulator analog core coupled to a gate of said low side (LS) switch, wherein said slope regulator analog core comprises an AC loop; and
   wherein said AC loop is connected between said output and said gate, comprises a capacitor, and is configured to integrate current across said capacitor during a turn-on phase; and,
   further comprising a slope regulation mode accomplished by connecting said AC loop by connecting each of said first and second AC loops to first and second current digital-to-analog-converters, respectively, in an interleaved manner.

9. The switching circuit of claim 8, further comprising a fast mode accomplished by connecting said AC loop to a power or ground rail.

10. The switch circuit of claim 8 further comprising a hold control mode accomplished by connecting said low side (LS) switch gate to power or ground rails after said turn-on phase or said turn-off phase is complete.

11. The switch circuit of claim 8 further comprising a MOS whose gate is electrically coupled to a negative bias voltage signal VBN and whose drain is connected to the gate of low side (LS) switch.

12. The switch circuit of claim 8, further comprising a MOS whose gate is electrically coupled to a positive bias voltage signal VBP and whose drain is connected to the gate of low side (LS) switch.

13. The switch circuit of claim 8, comprises a Finite State Machine (FSM) that receives logic control signals that decides whether the gate should be switched in fast mode or in slope regulation mode.

14. A method of a switch circuit comprising the steps of:
   (a) providing a circuit comprising a low side (LS) switch, a high side (HS) switch, and a slope regulator wherein said slope regulator comprises a slope regulator mode;
   (b) wherein said slope regulator comprises a first AC loop connected to an output and a gate of the device for which slope regulation is desired; and,
   (c) providing a current to said first AC loop, controlled by a first Idac, in slope regulator mode;
   (d) wherein said slope regulator further comprises
   a second AC loop connected to an output and a gate of the device for which slope regulation is desired; and
   providing a current to said second AC loop, controlled by a second Idac, in slope regulator mode.

15. The method of a switch circuit of claim 14, wherein said slope regulator further comprises a fast mode.

16. The method of a switch circuit of claim 15, wherein said slope regulator further comprises a hold mode.

17. The method of a switch circuit of claim 15, wherein slope regulator further comprises
   choosing a fast mode or a slope regulation mode;
   applying either a fast mode or slope regulation mode;
   evaluating the polarity of the signal; and,
   toggle signal hold_on if the gate is low or toggle signal hold_off if the gate is high.

* * * * *